United States Patent
Smith (10) Patent No.: US 7,822,145 B1
(45) Date of Patent: Oct. 26, 2010

(54) METHOD AND SYSTEM FOR GENERATING SYNTHETIC WAVEFRONT PHASE/TIME DELTA OF ARRIVAL

(75) Inventor: Mitchell Evan Smith, Dayton, OH (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 607 days.

(21) Appl. No.: 11/894,452

(22) Filed: Aug. 21, 2007

(51) Int. Cl.
*H04L 27/00* (2006.01)
(52) U.S. Cl. .................................. 375/295; 375/372
(58) Field of Classification Search ............... 375/316, 375/295, 372
See application file for complete search history.

(56) References Cited

U.S. PATENT DOCUMENTS 6,101,551 A * 8/2000 Kanoh .................... 709/245
6,434,664 B1 * 8/2002 Buch et al. ................ 711/112

* cited by examiner

*Primary Examiner*—Emmanuel Bayard
(74) *Attorney, Agent, or Firm*—RatnerPrestia (57) ABSTRACT

A system and method for generating signals providing a synthesized wavefront phase to at least one receiver is disclosed. The system includes a buffer having a length of registers and a controller that sequences data through the length of registers. The controller determines at least two dynamically assignable registers along the length of registers to output the data. First and second signal generators are configured to receive the data from respective dynamically assignable registers. Using a clocking signal to sequence the data through the length of registers, the first and second signal generators provide the synthesized wavefront phase, based on the data received from the two dynamically assignable registers.

29 Claims, 5 Drawing Sheets

METHOD AND SYSTEM FOR GENERATING SYNTHETIC WAVEFRONT PHASE/TIME DELTA OF ARRIVAL

FIELD OF THE INVENTION

The present invention relates, in general, to a system and method of transmitting RF signals for exercising a system under test (SUT). More particularly, the present invention relates to simulating multiple RF signals transmitted from a mobile platform forming a wavefront phase or a time delta of arrival at the SUT. The simulation of pulse and wavefront distortions are based on dynamic aspect angle variations of the platform in motion. The simulated phase and time difference of arrival (TDOA) of the received wavefront is accomplished without the use of digital RF memory components (DRFM) or RF delay lines.

BACKGROUND OF THE INVENTION

Conventional systems that generate signals having a particular wavefront phase, for example, use temperature sensitive phase matched Radio Frequency (RF) delay lines. Such systems suffer from both temperature and frequency sensitivity.

What is needed is a system that simulates a wavefront phase from multiple RF signals transmitted from a platform toward at least one receiver being tested. Furthermore, the system should be implemented without the use of DRFM or RF delay lines.

SUMMARY OF THE INVENTION

The present invention is embodied in a system and method for generating signals providing a synthesized wavefront phase to at least one receiver is disclosed. The system includes a buffer having a length of registers and a controller that sequences data through the length of registers. The controller determines at least two dynamically assignable registers along the length of registers to output the data. First and second signal generators are configured to receive the data from respective dynamically assignable registers. Using a clocking signal to sequence the data through the length of registers, the first and second signal generators provide the synthesized wavefront phase, based on the data received from the two dynamically assignable registers.

The present invention is also embodied in a system and method for delaying at least one signal using a sequence of control data to control a plurality of signal generation units. The method includes sequencing the control data through a series of memory registers of a buffer in a predetermined order and selecting respective ones of the memory registers of the buffer to assign to first and second signal generation units. The method also includes supplying the control data sequenced to a first selected memory register to the first signal generation unit and the control data sequenced to a second selected memory register to the second signal generation unit. The method further includes generating, via the second signal generation unit, a temporally delayed version of a signal produced by the first signal generation unit.

The present invention is also embodied in a wavefront phase control unit that receives a stream of control data to control first and second signal generation units. The control unit includes a buffer having a series of memory registers, and a control information generation unit that generates the stream of control data to sequence through the series of memory registers of the buffer in a predetermined order. The control unit also includes a buffer output controller that dynamically selects respective ones of the memory registers of the buffer to assign to the first and the second signal generation units. The buffer output controller controls the buffer to output the control information sequenced to the selected memory registers to the first and second signal generation units. The digital control data output to the first and second signal generation units controls generation of signals from the first and second signal generators that provide a synthesized wavefront phase.

BRIEF DESCRIPTION OF THE DRAWINGS

The invention is best understood from the following detailed description when read in connection with the accompanying drawings. It is emphasized that, according to common practice, various features/elements of the drawings may not be drawn to scale. Moreover, in the drawings, common numerical references are used to represent like features/elements. Included in the drawing are the following figures.

DETAILED DESCRIPTION OF THE INVENTION

Figure 1:
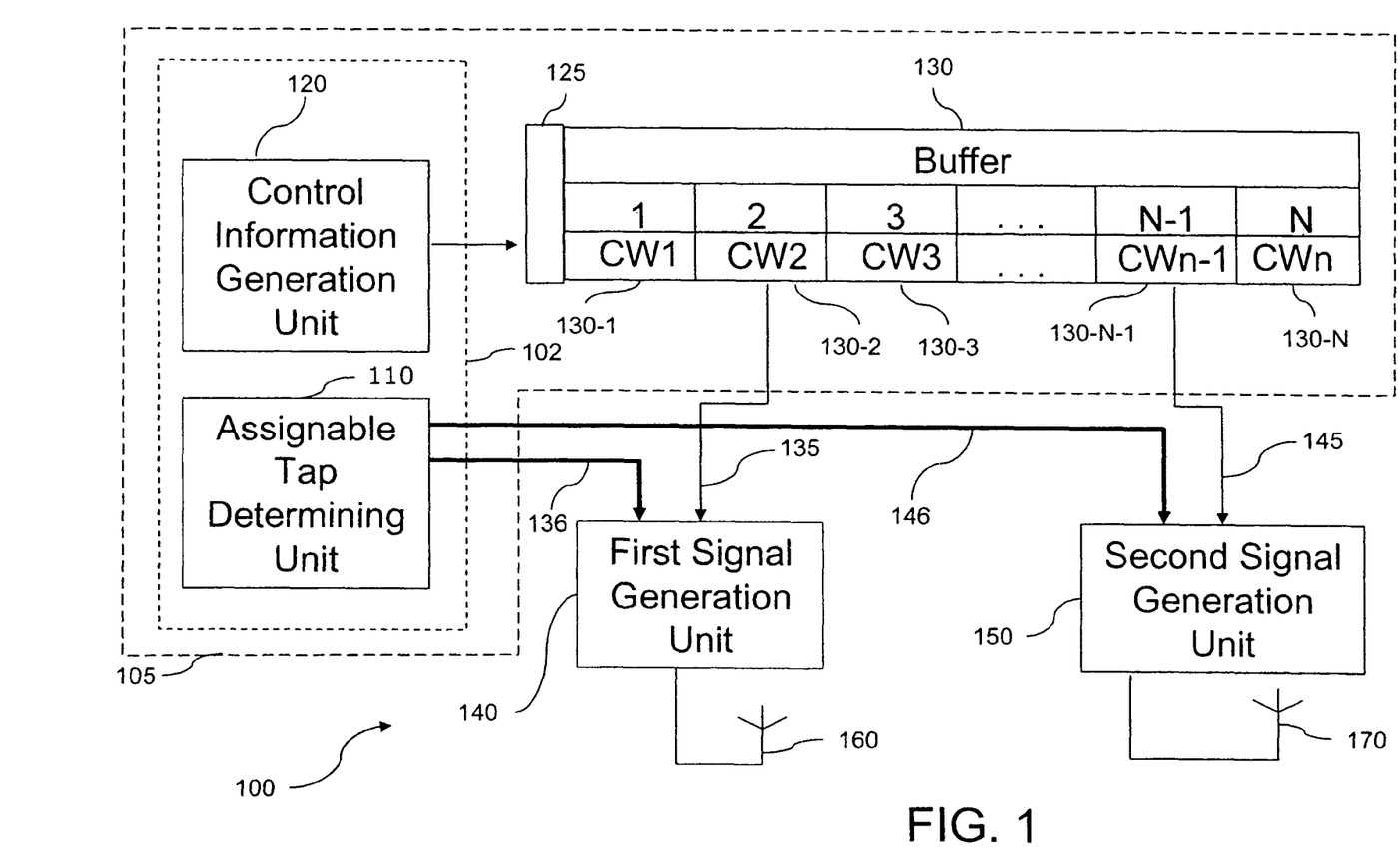
FIG. 1 is a block diagram illustrating transmitter 100 according to an embodiment of the invention.

FIG. 1 is a block diagram illustrating transmitter 100 according to an exemplary embodiment of the invention. As shown, transmitter 100 includes wavefront generation control (WGC) unit 105, first signal generation unit 140, second signal generation unit 150, first antenna 160 and second antenna 170. The WGC unit 105 is coupled to first signal generation unit 140 via first assignable tap 135 and also coupled via first tap control 136. The WGC unit 105 is further coupled to second signal generation unit 150 via second assignable tap 145 and also coupled via second tap control 146. The first signal generation unit 140 is coupled to first antenna 160 and second signal generation unit 150 is coupled to second antenna 170.

Control information (e.g., codewords) CW1, CW2, CW3 . . . CWn is provided by WGC unit 105 to control first signal generation unit 140 and second signal generation unit 150 via first and second assignable taps 135 and 145, respectively. The control information CW1, CW2, CW3 . . . CWn may be one or more sequences of codewords (e.g., one or more bytes may be included in each codeword) that control the generation of signals from first and second generation units 140 and 150 for transmission by first and second antennas 160 and 170, respectively.

The WGC unit 105 includes control unit 102, input buffer 125 and buffer 130 having memory registers 130-1, 130-2, 130-3 . . . 130-N. The control unit 102 includes assignable tap determining unit 110 and control information generation unit 120. The assignable tap determining unit 110 directs each generation unit 140 and 150 to acquire control information CW1, CW2, CW3 . . . CWn from buffer 130 at a particular memory register, during a memory register transfer (MRT) cycle, (e.g., a clock cycle). For example, first signal generation unit 140 may acquire code word CW2 from register 130-2 in a first clock cycle and may acquire other code words from a series of other registers in other MRT cycles. That is, assignable taps 135 and 145 may be dynamically assigned to any one of memory registers 130-1, 130-2, 130-3 ... 130-N on a cycle-by-cycle basis.

The control information generation unit 120 may generate control information (code words CW1, CW2, CW3 ... CWn) which are latched into input buffer 125 and, then, sequenced though memory registers 130-1, 130-2, 130-3 ... 130-N of buffer 130. As these code words traverse the length of buffer 130 in a defined order, they are temporarily stored in each of the memory registers for a predetermined number of clock cycles. When a respective code word reaches a register (e.g., 130-2), which is selected as assigned to first assignable tap 135, the code word is output to first signal generation unit 140. The same code word which is temporarily resident in memory register 130-2 continues down the sequence of memory registers 130-3 ... 130-N−1 and 130-N.

As the same or a different code word in the sequence reaches second assignable output 145, assigned to memory register 130-N−1, the code word is output to second signal generation unit 150.

The clock rate or MRT rate for buffer 130 may be between 1 MHz to 10 GHz. The MRT period may be set between 0.25 and 100 ns using known clocking techniques.

In certain embodiments, the assignments of generation units 140 and 150 to selected memory registers 130-1, 130-2, 130-3 ... 130-N may be statically assigned. In these embodiments, the output of one generation unit (e.g., generation unit 150) may be characterized as a delayed version of the output from the other generation unit (e.g., generation unit 140) and the buffer 130 acts as a digital delay line. In such embodiments, the use of assignable tap determining unit 110 may be optional.

In other embodiments, the assignments of generation units 140 and 150 to selected memory registers 130-1, 130-2, 130-3 ... 130-N may be dynamically assigned. In these embodiments, the output of one generation unit (e.g., generation unit 150) may not be a delayed version of the output to the other generation unit (e.g., generation unit 140).

For example, code word CW2 may reach first generation unit 140 via first assignable tap 135 but may never reach second generation unit 150. That is, during a first MRT cycle, code word CW2 may reach memory register 130-2 and may be output to first generation unit 140 via first assignable tap 135. Code word CW2 may then continue to sequence through buffer 130. Second assignable tap 145 may be dynamically (programmatically) assigned to memory register 130N-1 during the first clock cycle and subsequently may be assigned to memory register 130-1. In such a configuration, second signal generation unit 150 may never acquire code word CW2.

A code word may correspond to an amplitude level for controlling amplitude modulation. As another example, a code word may correspond to a frequency for controlling frequency modulation. Yet another example, a code word phase may correspond to a phase for controlling modulation of a signal.

In certain embodiments, the control information may be latched into input buffer 125 from more than one source. The data buffer may then be a multi port data buffer, such as a dual port FIFO or a three port FIFO.

Figure 2:
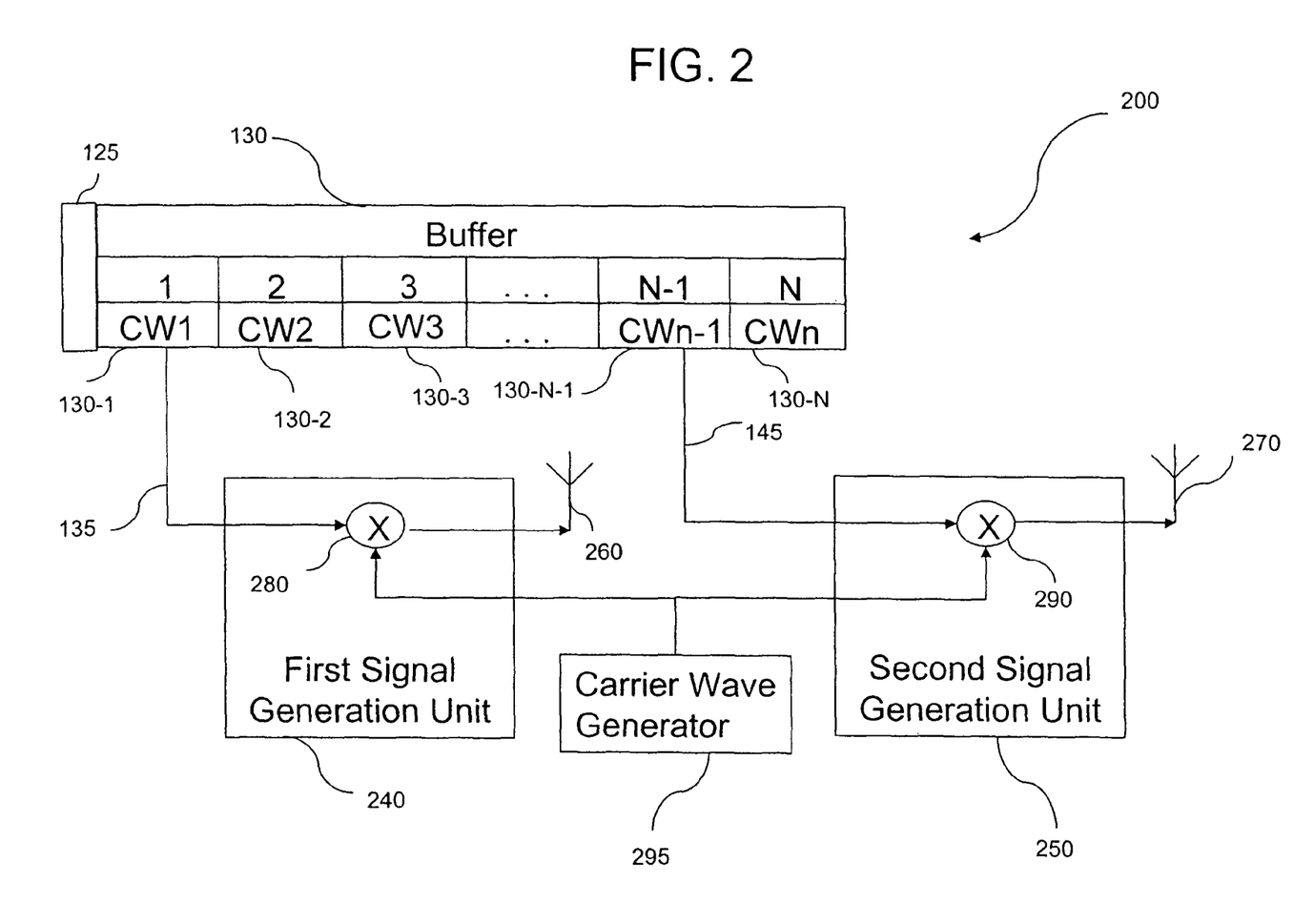
FIG. 2 is a block diagram illustrating transmitter 200 according to another embodiment of the invention.

FIG. 2 is a block diagram illustrating transmitter 200 according to another embodiment of the invention. For brevity, WGC unit 105 is not shown in FIG. 2. Transmitter 200 operates similarly to that of transmitter 100 except that it includes mixers 280 and 290 and common carrier wave generator 295. The buffer 130 receives code words from input buffer 125 and outputs these code words via first and second assignable taps 135 and 145. Each code word includes amplitude information to modulate a carrier wave signal provided from common carrier wave generator 295. The AM modulated signal output from first AM unit 280 is provided to first antenna 260 for transmission. The AM modulated signal output from second AM unit 290 is provided to second antenna 270 for transmission.

As will be explained, signals transmitted by antennas 260 and 270 simulate a wavefront phase/delta time of arrival between two transmission sources.

Figure 3:
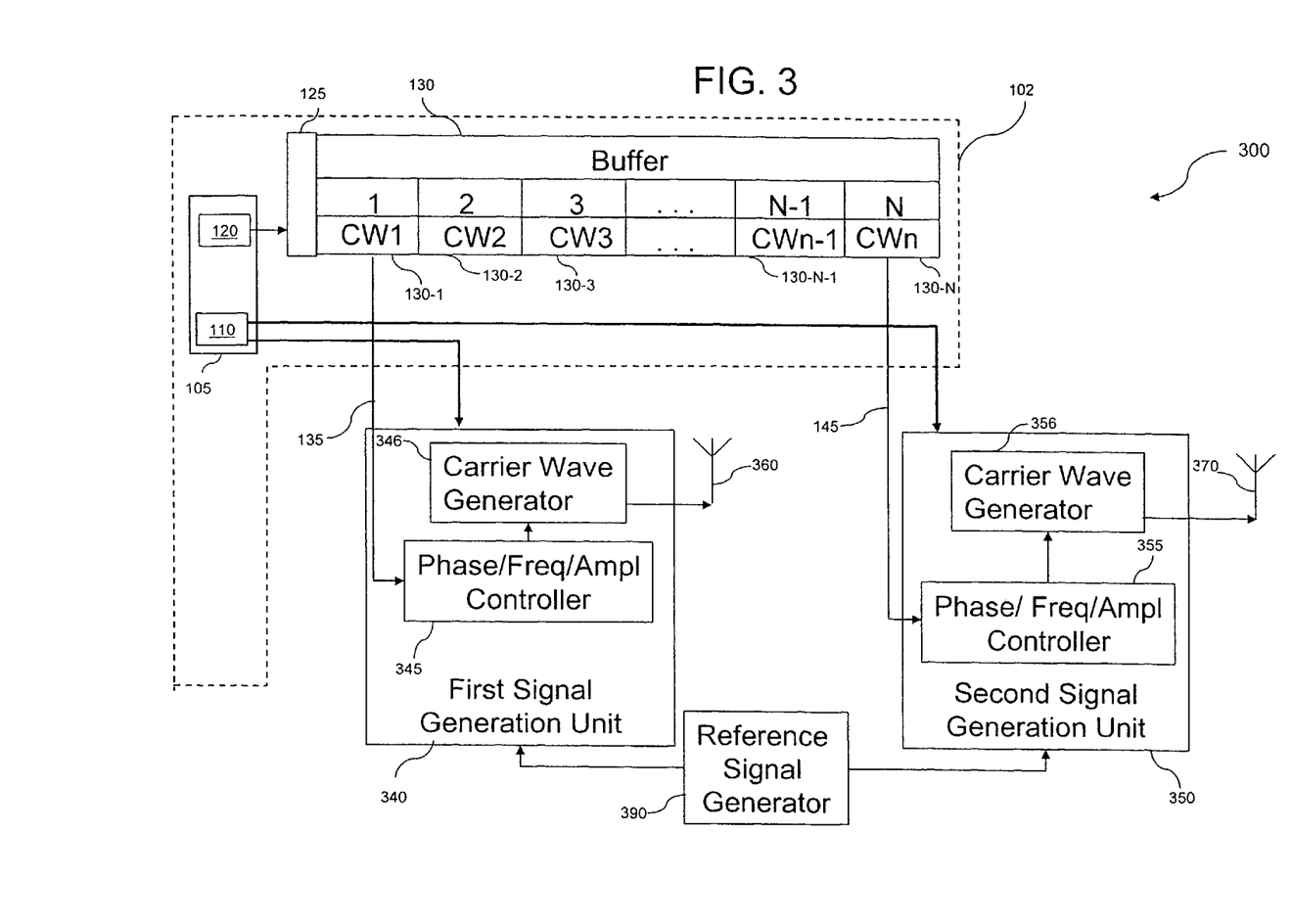
FIG. 3 is a schematic diagram illustrating transmitter 300 according to yet another embodiment of the invention.

FIG. 3 is a schematic diagram illustrating transmitter 300 according to yet another embodiment of the invention. As shown, transmitter 300 operates similarly to that of transmitter 100, except that it includes controllers 345 and 355 and carrier wave generators 346 and 356. FIG. 3 includes the same WGC unit 105 shown in FIG. 1. The code words control (1) phase; (2) frequency; and/or (3) amplitude, which in turn control the signals generated by carrier wave generators 346 and 356. For example, code words CW1, CW2, CW3 CWn may include: (1) one or more bits indicating phase adjustment to a reference signal generated by generator 390; (2) one or more bits indicating a frequency adjustment to the reference signal generated by generator 390; and/or (3) one or more bits indicating amplitude adjustment to the reference signal generated by generator 390.

The signals generated by signal generation units 340 and 350 simulate a wavefront phase between two transmission sources mounted on a platform (e.g., an aircraft, or some other mobile platform). By dynamically assigning each signal generation unit to a series of memory registers, the wavefront phase (delta time of arrive) between the output signals may be advanced or delayed temporally with respect to each other.

The buffer 130 may include a relatively large number of memory registers, for example, in the range of 100 memory registers to about $1 \times 10^7$ memory registers. The number of memory registers determines the maximum range for propagating the wavefront. For example, if buffer 130 includes $1 \times 10^7$ registers, then with an MRT period of 0.93 ns, about 18,400 nautical miles of absolute phase accuracy may be simulated.

Two signal generation units are shown in FIG. 3. It is contemplated, however, that any number of such generation units may be included.

Figure 4:
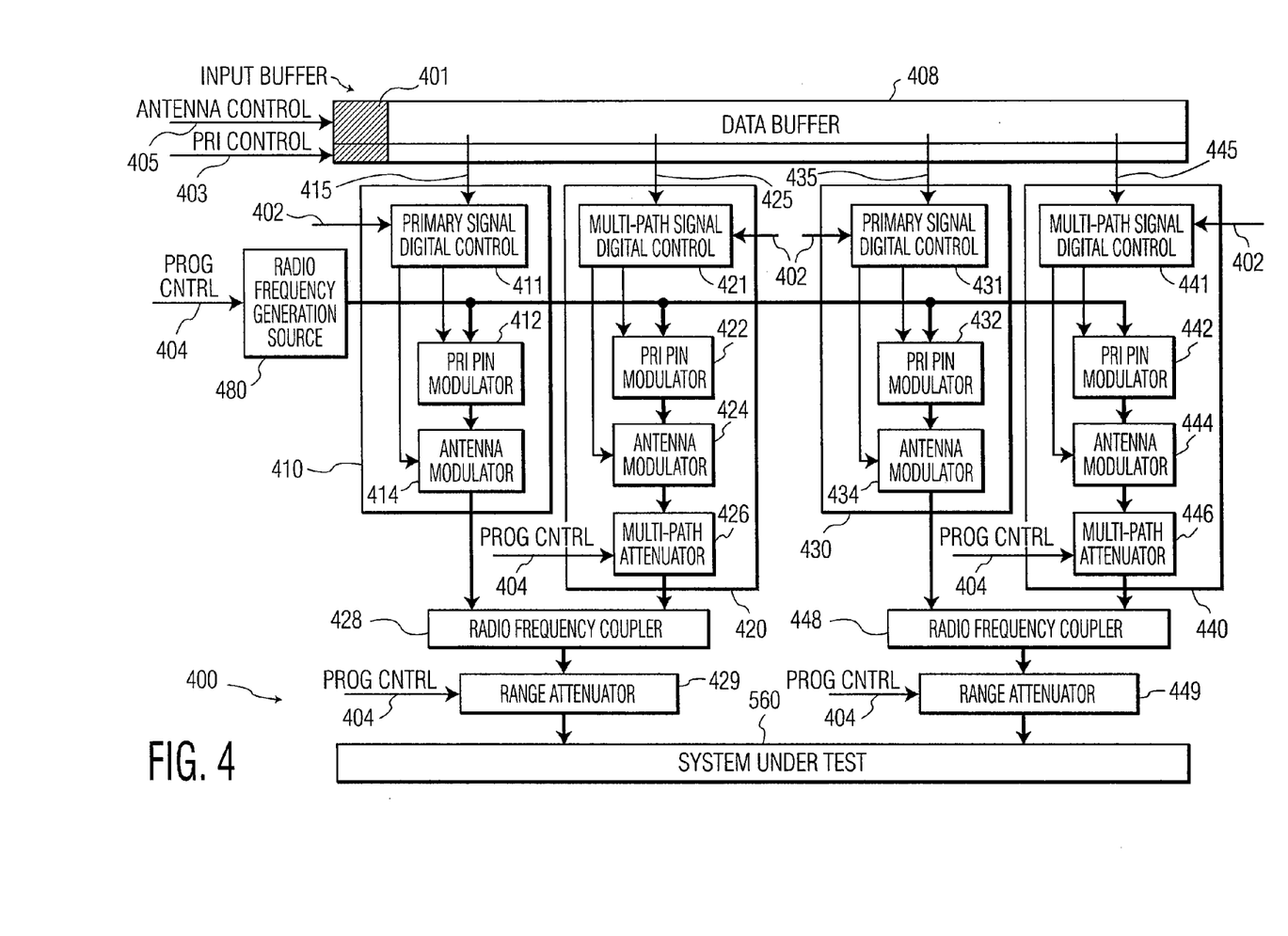
FIG. 4 is a schematic diagram illustrating transmitter 400 according to a further embodiment of the invention.

FIG. 4 is a schematic diagram illustrating transmitter 400 according to a further embodiment of the invention. As shown, transmitter 400 includes input buffer 401, tap control 402, pulse repetition interval (PRI) control 403, program (PROG) control 404, antenna control 405, first generation unit 410, first multi-path generation unit 420, first frequency coupler 428, first range attenuator 429, data buffer 408, first assignable tap 415, second assignable tap 425, second generation unit 430, third assignable tap 435, second multi-path generation unit 440, fourth assignable tap 445, second frequency coupler 448 and second range attenuator 449.

The data buffer 408 may be a FIFO buffer and may have input and output clocks. The output clock may be the inverse of the input clock to allow the data within the FIFO to settle prior to being output.

The first and second generation units 410 and 430 include primary signal digital controls 411 and 431, primary PRI modulators (e.g., a PIN modulator) 412 and 432 and primary antenna modulators 414 and 434, respectively. The first and second multi-path generation units 420 and 440 include multi-path signal digital controls 421 and 441, multi-path PRI modulators 422 and 442, multi-path antenna modulators 424 and 444 and multi-path attenuators 426 and 446, respectively.

Tap control 402 generates assignment information used by first primary signal digital control 411, first multi-path signal digital control 421, second primary signal digital control 431 and second multi-path signal digital control 441. The assignment information selects buffer locations (not shown) in data buffer 408 for assignable taps 415, 425, 435 and 445, respectively.

Data buffer 408 is a dual port buffer sequencing both antenna control information and PRI control information. The antenna control and PRI control information may be sequenced independently of each other. The antenna control information and PRI control information may be concatenated together. The concatenated information may be input to a single port data buffer.

It is contemplated that in certain embodiments, frequency or phase modulation may be implemented. In such configurations, each generation unit may utilize RF generation source 480, while antenna control 405 includes a series of composite code words to control the generation units. That is, a portion of the composite code word may control phase or frequency modulation of the first generation unit, and other portions may control the second generation source. In another embodiment, instead of using composite code words, each generation unit may have a separate code word and the data buffer may include a plurality of ports to accommodate the separate code words.

Antenna control 405 generates control information or code words to control primary and multi-path antenna modulators 414, 424, 434 and 444. A sequence of the code words are latched into input buffer 401 and sequenced through data buffer 408. These code words are output, in a sequenced manner, via assignable taps 415, 425, 435 and 445 to first generation unit 410, first multi-path generation unit 420, second generation unit 430 and second multi-path generation unit 440, respectively. The assignments of assignable taps 415, 425, 435 and 445 are dynamic and may be changed to any other memory register of data buffer 408.

First primary signal digital control 411 passes PRI control information to first PRI modulator 412 as the data is sequenced through data buffer 408 and received dynamically via assignable tap 415. First PRI modulator 412 is configured to receive an RF signal from generation source 480. The generation source 480 may be programmable via PROG control 404 based on phase, frequency and/or amplitude information.

PROG control 404 may simulate an operating environment of a platform, such as aircraft 600 (see FIG. 5). The platform may include one or more transmission sources that may be received by a SUT. The wavefront phase of the signals from the transmission sources varies according to the number of sources, the orientation and distance of those sources from the SUT, and the multi-path effects of the simulated environment on the sources.

PROG control 404 may control the frequency of the RF signal from generation source 480 based on a simulation of SUT 560 moving towards or away from the platform. For example, the frequency of the RF signal may be increased if SUT 560 and the simulated platform are moving towards each other, but may be decreased if they are moving away from each other, based on Doppler shift.

First primary PRI modulator 412 receives the PRI control information from first primary signal digital control 411 and performs ON/OFF modulation using, for example, a PIN modulator.

First primary antenna modulator 414 amplitude modulates the signal received from first primary PRI modulator 412 to generate an AM modulated signal, representing antenna gain as a function of aspect angle.

First multi-path generation unit 420 simulates a multi-path signal due to the multi-path environment between the aircraft (for example) and the SUT. Although FIG. 4 shows a single multi-path signal generated from the primary path signal, it will be appreciated that the present invention may include multiple multi-path generation units. As shown, first multi-path signal digital control 421, first multi-path PRI modulator 422 and first multi-path antenna modulator 424 perform similar functions to those of first primary signal digital control 411, first primary PRI modulator 412 and first primary antenna modulator 414, respectively. Multi-path attenuator 426 inserts the programmed attenuation due to the multi-path environment.

The first frequency coupler 428 receives the outputs from first generation unit 410 and first multi-path generation unit 420 and provides a summed output signal. The summed output signal is attenuated by first range attenuator 429 based on PROG control 504 in accordance with range estimates between simulated platform 600 and SUT 560.

Second primary generation unit 430, second multi-path generation unit 440, second frequency coupler 448 and second range attenuator 449 function in the same manner as first primary generation unit 410, first multi-path generation unit 420, first frequency coupler 428 and first range attenuator 429 to produce a second primary signal and a single multi-path signal. Second primary signal digital control 431 and second multi-path signal digital control 441 receive inputs via third assignable tap 435 and fourth assignable tap 445, respectively.

In various embodiments, control information from PRI control 403 is a series of control bits, each bit providing either an ON state or OFF state to PRI modulators 412, 422, 432 and 442. The PRI bits are latched into input buffer 401 and clocked into a sequence of registers in data buffer 408.

Antenna control 405 may be an eight bit wide digital word representing a maximum word of $FF_{16}$ or $255_{10}$. For amplitude modulation, the least significant bit (LSB) value of antenna control 405 may represent a 0.25 dB attenuation. Consequently, the AM range is a variable between 0 dB and 63.75 dB. The digital words latched into input buffer 401 are clocked into a sequence of registers in data buffer 408. The antenna control may have a pulse width (PW) of 1 to 50 ms and an inter-pulse period (IPP) of 50 to 5000 ms. The digital word(s) for the Antenna Control and PRI control are latched into input buffer 125 and remain there for their prescribed time. For example, assume that the PRI has a pulse width (PW) of 5 milliseconds and an inter pulse period (IPP) of 500 milliseconds. The PW remains latched in the input buffer for a period of 5 milliseconds, creating approximately 5000 one nanosecond slices of binary information. Conversely, as the IPP is presented at the input buffer for 500 milliseconds, creating approximately 500,000 one nanosecond slices of binary information.

PRI and antenna controls 403 and 405 are shown as separate streams of data. These separate streams may be clocked into input buffer 401 at different rates. The outputs of input buffer 401 may be separate streams, as well. It is also possible to preprocess the PRI and antenna controls into one stream, for example, by an AND operation.

The number of memory locations that separate the assignable taps represent the physical separation between the signal transmitters on the simulated platform which produces the wavefront phase delta as seen by SUT 560. For example, if first and third assignable taps 415 and 435 are separated by 100 memory locations, with a 1 ns MRT period (signals propagate in air about 11.2 inches per nanosecond (ns)), a physical separation between signal sources of 1120 inches or 93.33 feet is achieved. Second and fourth assignable taps 425 and 445 represent the wavefront phase delta between the signals due to multi-path effects as seen by SUT 560.

Figure 5A:
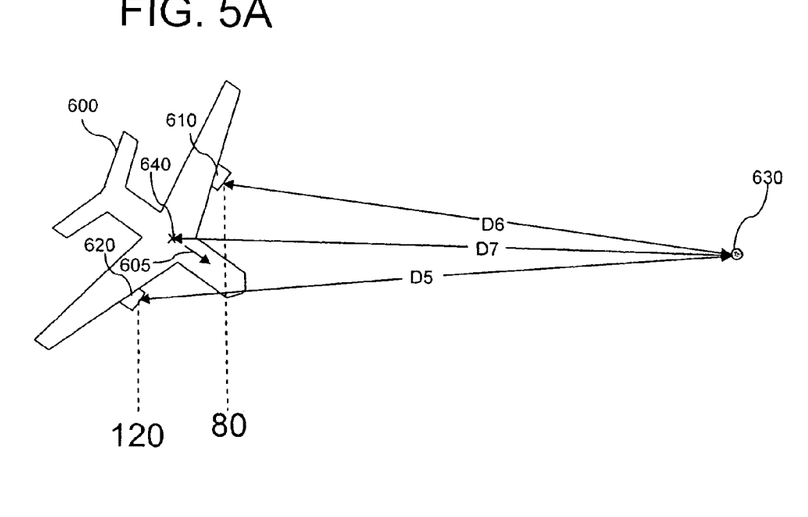
FIGS. 5A, 5B and 5C are top views of aircraft 600 illustrating the operation of assignable taps, for example, 135 and 145, in accordance with an embodiment of the present invention.
Figure 5B:
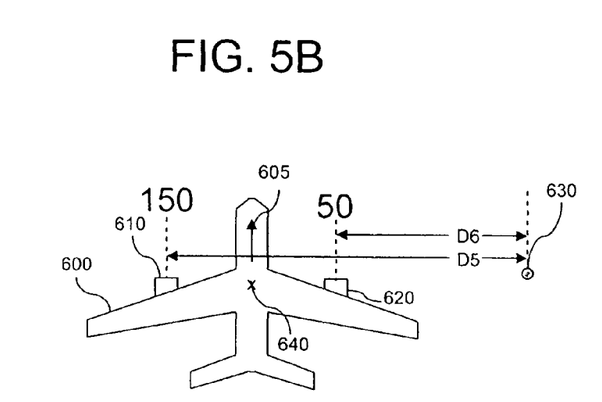
Figure 5C:
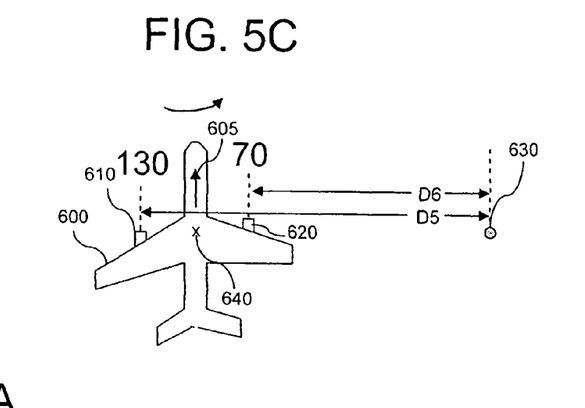

FIGS. 5A, 5B and 5C are top views of aircraft 600 illustrating the operation of assignable taps, for example, 135 and 145, in accordance with an embodiment of the present invention.

As shown in FIG. 5A, aircraft 600 is traveling in a direction illustrated by arrow 605 and has signal generation units (e.g., transmission sources) 610 and 620 disposed under its wings. With respect to a point-of-origin designated 630 (for example, representing the location of a receiver), signals from first signal generation unit 610 begin propagating as a wavefront from the left wing while signals from second signal generation unit 620 begin propagating as another wavefront from the right wing. The distance D6 denotes the distance between first signal generation unit 610 and point-of-origin 630 and the distance D5 denotes the distance between second signal generation unit 620 and point-of-origin 630. The distance D7 denotes the distance between centerline 640 of aircraft 600 and point-of-origin 630.

First assume that aircraft 600 is oriented as shown in FIG. 5B with respect to point-of-origin 630. In such a configuration, assignable tap determining unit 110 assigns centerline 640 of aircraft 600 to the middle register of buffer 130. That is, if the number of registers is 200 locations deep, centerline 640 is assigned register location 100. If the wing span of aircraft 600 is 100 feet, then FIFO address 50 is assigned as one "pick-point" and FIFO address 150 is assigned as the other "pick-point."

The data incoming to buffer 130 (FIG. 1) is clocked from input buffer 130. Since the data first reaches the first "pick-point" at FIFO address 50, it takes an additional 100 nanoseconds (approximately to reach the second "pick-point" at FIFO address 150. Because the data has not changed, the present invention has effectively simulated a 100 nanoseconds delay in the formation of the wavefront, toward the system under test.

Next, assume that the platform starts with the left wing at FIFO address 50 and the right wing at FIFO address 150 (FIG. 5B), and then the platform performs a counter-clockwise barrel roll, as shown in FIG. 5C. The assignable tap determining unit, based on new distances from the point-of-origin, adjusts the "pick-points" to new FIFO locations. The "pick-point" at FIFO location 50 will increase to 70, for example; the "pick-point" at FIFO location 150 will decrease to 130, for example.

Continuing the example, once the platform reaches a roll angle of 90° with respect to the point-of-origin, then all the "pick-points" will be reading data from FIFO address 100. This is so, because the D5 and D6 distances are equal to the D7 distance (not shown in FIG. 5C).

As the platform continues the roll to 180°, the "pick-point" that was originally reading from FIFO address 50 will now be reading data from FIFO location 150; the "pick-point" that was originally reading from FIFO address 150 will now be reading data from FIFO location 50. In other words, the platform is now up-side down.

It will be appreciated that in the above roll example, the "pick-point" at FIFO address 50 is increasing and "chasing" the data at it is sequencing through the buffer registers. This "chasing" results in stretching (widening) the PRI control data and stretching the antenna control data.

Concurrently, the "pick-point" at FIFO address 150 is decreasing and "running into" the data, as the data is sequencing through the buffer registers. This "running into" the data results in compressing the PRI control data and compressing the antenna control data.

In a similar manner, the present invention effectively simulates a wavefront due to a yaw or a heading maneuver of the platform. This is best shown in FIG. 5A. Calculations in this plane of geometry results in simulating the platform flying past the point-of-origin. As seen, the angle-of-arrival (AOA) is changed in azimuth. Assuming a 40 feet range difference to point-of-origin 630 between D6 and D5, the present invention will assign first assignable tap 135 to FIFO address 80 and second assignable tap 145 (FIG. 1) to FIFO address 120.

Although a clock rate of 1 GHz has been assumed, it is contemplated other clock rates for buffer 130 are also possible. Further, by providing additional memory and faster clock rates would allow for improved resolution.

Although signals from first and second generation units 610 and 620 of aircraft 600 are illustrated, it is contemplated that multi-path signals related to these signals may also be generated in a similar manner. It is also contemplated that the first and second generation units and the first and second multi-path generation units may be located on separate platforms.

One of skill in the art understands that the wavefront phase difference is based on path lengths (e.g., D5 and D6) which operate the same in FIGS. 5A-5C. Thus, the wavefront phase difference at each receiver from an emission source may be simulated using the transmitter 400 with the same adjustment of tap control as discussed with respect to FIGS. 5A-5C.

It is contemplated that transmitter 400 may be used to simulate: (1) the wavefront phase difference of two or more transmission sources at a single receiver (as shown in FIGS. 5A-5C); or (2) the wavefront phase difference at two or more receivers from a single transmission source.

It is further contemplated that other configurations of transmission sources and receivers may be simulated by transmitter 400 using superposition principles. That is, for example if two transmitters and two receivers are being simulated the wavefront phase at the receivers may be based on the superposition of the individual transmission signals.

It is also contemplated that the effect of moving transmission sources and moving receivers may be simulated using a plurality of transmitters 400 such that the movement of the transmission sources is simulated by a first transmitter and the movement of the receivers is simulated by second transmitter. In such an embodiment the output of the assignable taps from the first transmitter may be input to the second transmitter, as the control information.

Although only two "pick-points" are disclosed, it is contemplated that any number of such "pick-points" may be implemented. The number of "pick-points" implemented may equal the number of receive or transmit antennas (ports) for the system under test or may correspond to the number of receive or transmit antennas (ports) for a plurality of platforms within, for example, a battle group.

Although the invention is described in terms of a system, it is contemplated that portions of the system may be implemented in hardware or in software for executing a program in microprocessors, ASICs or general purpose computers. This software may be embodied in a tangible computer readable carrier, for example, a magnetic or optical disk, or a memory-card.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A system for generating signals providing a synthesized wavefront phase to at least one receiver, comprising:
   a buffer having a length of registers,
   a controller for sequencing data through the length of registers,
   the controller determining at least two dynamically assignable registers along the length of registers for outputting the data, and
   first and second signal generators configured to receive the data from the two dynamically assignable registers, respectively,
   wherein a clocking signal sequences the data through the length of registers and the first and second signal generators provide the synthesized wavefront phase, based on the data received from the two dynamically assignable registers.

2. The system according to claim 1, wherein:
   the data includes a stream of digital control data;
   the buffer receives the stream of digital control data and sequences the stream of digital control data through the length of registers in a defined order;
   the controller, each transfer cycle, determines (1) one of the respective registers from among the length of registers to assign to the first signal generator and (2) the one or a different one of the respective registers from among the length of registers to assign to the second signal generator such that a first sequence of the digital control data is received by the first signal generator during a plurality of transfer cycles, and a second sequence of the digital control data is received by the second signal generator during the plurality of transfer cycles.

3. The system according to claim 2, wherein:
   the first signal generator transmits a first signal in accordance with the received first sequence of the digital control data, and
   the second signal generator transmits a second signal in accordance with the received second digital control data.

4. The system according to claim 3, wherein the controller determines the at least two dynamically assignable registers based on one or more distances of simulated transmission sources to the at least one receiver.

5. The system according to claim 2, wherein the controller includes:
   an output controller assigning the first signal generator to the one determined register of the length of registers and the second signal generator to the one determined register or the different register of the length of registers during a first transfer cycle and reassigning the first signal generator to another register of the length of registers and the second signal generator to a further register of the length of registers during a second transfer cycle.

6. The system according to claim 2, wherein an interval corresponding to each transfer cycle of the digital control data sequenced through the buffer from each respective register to a subsequent register is in a range of 1 MHz to 10 GHz.

7. The system according to claim 2, wherein the first and second signal generators are configured to receive a reference signal and each outputs a signal adjusted relative to the reference signal for an amplitude in accordance with the digital control data received by the first and second signal generators, respectively.

8. The system according to claim 2, wherein the first and second signal generators are configured to each receive a different reference signal and the first and second signal generators each output a signal adjusted relative to the received reference signal for at least one of: (i) a phase; (ii) a frequency; or (iii) an amplitude in accordance with the digital control data received by the first and second signal generators, respectively.

9. The system according to claim 3, wherein the first and second signal generators include first and second antennas to transmit the first and second signals, respectively.

10. The system according to claim 4, further comprising:
    a simulation processor for calculating a multi-path delay of the first signal based on a multi-path environment of a first one of the simulated transmission sources, wherein the controller determines, one of the at least two dynamically assignable registers based on the calculated multi-path delay for transmission of the second signal.

11. The system according to claim 10, further comprising:
    an attenuator coupled to the second signal generator, wherein
    the simulation processor further calculates a multi-path attenuation of the first signal based on the multi-path environment of the first one of the simulated transmission sources, and controls the attenuator to attenuate the second signal from the second signal generator in accordance with the calculated multi-path attenuation of the first signal.

12. The system according to claim 3, further comprising:
    at least one antenna, wherein the signals output by the first and second signal generators are configured to be transmitted by the at least one antenna.

13. The system according to claim 10, further comprising:
    a further signal generator assigned to another dynamically assignable register, each transfer cycle to generate an additional signal, the other dynamically assignable register that is determined each transfer cycle is not based on the calculated multi-path delay.

14. A method for generating signals to provide a synthesized wavefront phase to at least one receiver, comprising:
    sequencing, by a controller, data through a length of registers using a clocking signal,
    determining, by the controller, at least two dynamically assignable registers along the length of registers for outputting the data, and
    receiving, by first and second signal generators, the data from the two dynamically assignable registers, respectively, and
    establishing, by the first and second signal generators, the synthesized wavefront phase, based on the data received from the two dynamically assignable registers.

15. The method according to claim 14, wherein:
    the length of registers form a buffer and the data includes a stream of digital control data,
    the step of sequencing the data through the length of registers includes sequencing, each transfer cycle, the stream of digital control data through the length of registers in a defined order;
    the step of determining the at least two dynamically assignable registers along the length of registers includes selecting, each transfer cycle, (1) one of the respective registers from among the length of registers to assign the first signal generator and (2) the one or a different one of the respective registers from among the length of registers to assign the second signal generator; and
    the step of receiving the data from the two dynamically assignable registers, respectively, includes receiving a first sequence of the digital control data during a plurality of transfer cycles, by the first signal generator and a second sequence of the digital control data during the plurality of clock cycles, by the second signal generator.

16. The method according to claim 15, further comprising the steps of:
modulating, by the first signal generator, a reference signal with the digital control data received from one of the at least two dynamically assigned registers, as a first modulated signal;
modulating, by the second signal generator, the reference signal with the digital control data received from the other one of the at least two dynamically assigned registers, as a second modulated signal; and
transmitting, by the first and second signal generators, first and second modulated signals to produce the synthesized wavefront phase at the at least one receiver.

17. The method according to claim 16, wherein the step of determining the first and second dynamically assignable registers is based on one or more distances of simulated transmission sources to the at least one receiver.

18. The method according to claim 14, further comprising the steps of:
assigning the first signal generator to the one determined register and the second signal generator to the one determined register or the different one of the registers during a first transfer cycle; and
reassigning the first signal generator to another register and the second signal generator to a further register during a second transfer cycle.

19. The method according to claim 16, wherein:
the step of modulating the reference signal with the respective digital control data received from one of the two dynamically assigned registers includes outputting the first modulated signal adjusted relative to the reference signal for an amplitude in accordance with the digital control data received by the first signal generator; and
the step of modulating the reference signal with the second respective digital control data received from the other one of the two dynamically assigned registers includes outputting the second modulated signal adjusted relative to the reference signal for an amplitude in accordance with the digital control data received by the second signal generator.

20. The method according to claim 16, wherein:
the first and second signal generators are configured to each receive a different reference signal;
the steps of modulating the reference signal with the respective digital control data received from one of the two dynamically assigned registers includes outputting the first modulated signal adjusted relative to a first reference signal for at least one of: (i) a phase; (ii) a frequency; or (iii) an amplitude in accordance with the digital control data received by the first signal generator; and
the steps of modulating the reference signal with the respective digital control data received from the other one of the two dynamically assigned registers includes outputting the second modulated signal adjusted relative to a second reference signal for at least one of: (i) a phase; (ii) a frequency; or (iii) an amplitude in accordance with the digital control data received by the second signal generator.

21. The method according to claim 17, further comprising the step of:
calculating a multi-path delay of the first modulated signal based on a multi-path environment of a first one of the simulated transmission sources, wherein the step of determining one of the dynamically assignable registers, each transfer cycle, is based on the calculated multi-path delay of the first modulated signal.

22. The method according to claim 21, further comprising the steps of:
calculating a multi-path attenuation of the first modulated signal based on the multi-path environment of the first one of the simulated transmission sources; and
controlling an attenuator to attenuate the second modulated signal in accordance with the calculated multi-path attenuation of the first modulated signal.

23. The method according to claim 21, further comprising the steps of:
assigning, a further signal generator, to another dynamically assignable register, each transfer cycle, to generate an additional signal, the other dynamically assignable register that is selected each transfer cycle is not based on the calculated multi-path delay.

24. The method according to claim 14, further comprising the step of:
dynamically changing assignments of the first and second signal generators to dynamically assign registers during the step of sequencing the stream of digital control data through the length of registers by sequentially reassigning (1) the first signal generator to a first set of registers; and (2) the second signal generator to a second set of registers during the step of sequencing.

25. The method according to claim 24, wherein the step of dynamically changing the assignments of the first and second signal generators includes dynamically changing the assignment of the first signal generator to sequentially move the assignment thereof in a direction opposite to the sequencing of the stream of digital control data such that the first signal generator produces a compressed signal relative to the signal when the assignment of the first signal generator is not moved.

26. The method according to claim 24, wherein the step of dynamically changing the assignments of the first and second signal generators includes dynamically changing the assignment of the first signal generator to sequentially move the assignment thereof in the same direction as the sequencing of the stream of digital control data such that the first signal generator produces a stretched signal relative to the signal when the assignment of the first signal generator is not moved.

27. A method of delaying at least one signal using a sequence of control data to control a plurality of signal generation units, comprising the steps of;
sequencing the control data through a series of memory registers of a buffer in a predetermined order;
selecting respective ones of the memory registers of the buffer to assign to first and second signal generation units;
supplying the control data sequenced to a first selected memory register to the first signal generation unit and the control data sequenced to a second selected memory register to the second signal generation unit; and
generating, via the second signal generation unit, a temporally delayed version of a signal produced by the first signal generation unit.

28. The method according to claim 27, further comprising the steps of:
predetermining the assignment of each one of the plurality of signal generation units to the selected register.

29. A wavefront phase control unit receiving a stream of control data to control first and second signal generation units, comprising:

a buffer having a series of memory registers;

a control information generation unit for generating the stream of control data to sequence through the series of memory registers of the buffer in a predetermined order; and a buffer output controller for dynamically selecting respective ones of the memory registers of the buffer to assign to the first and the second signal generation units and for controlling the buffer to output the control information sequenced to the selected memory registers to the first and second signal generation units such that the digital control data output to the first and second signal generation units controls generation of signals from the first and second signal generators that provide a synthesized wavefront phase.

* * * * *